United States Patent [19]

Green

[11] 4,077,557

[45] Mar. 7, 1978

[54] DIP STORAGE, INSERTION AND EJECTION TOOL

[76] Inventor: LaVerne Merritt Green, 8 Kevin Dr., Danbury, Conn. 06810

[21] Appl. No.: 691,535

[22] Filed: Jun. 1, 1976

[51] Int. Cl.² .......................................... H05K 13/04
[52] U.S. Cl. .................... 227/83; 227/121; 29/741; 29/816; 221/245; 221/275
[58] Field of Search ................. 29/739, 741, 816, 818; 227/67, 121, 83; 221/239, 245, 255, 274, 275

[56] References Cited

U.S. PATENT DOCUMENTS

| | | | |
|---|---|---|---|
| 2,228,778 | 1/1941 | Pankonin | 227/121 |
| 3,550,238 | 12/1970 | Allen et al. | 29/741 X |
| 3,552,627 | 1/1971 | Moreno | 227/121 |
| 3,734,375 | 5/1973 | Bone et al. | 227/67 |
| 3,780,415 | 12/1973 | Ragard | 29/741 X |
| 3,888,402 | 6/1975 | Bone | 227/67 X |
| 3,896,533 | 7/1975 | Ullman et al. | 29/741 X |

*Primary Examiner*—Stanley H. Tollberg
*Assistant Examiner*—David A. Scherbel

*Attorney, Agent, or Firm*—Mattern, Ware, Davis & Stoltz

[57] ABSTRACT

A lightweight portable hand-held tool for use in producing printed circuit assemblies is provided with a squeezable handle piston grip surmounted by an incrementally detented ejection mechanism. The tool is topped by a rearwardly raked loading "snorkel" engaging and holding "dipstick" storage tubes for dual in line package or "DIP" integrated circuit assemblies, aligned end to end therein for lengthwise sliding, dispensing movement. A squeezable trigger-handgrip actuates a rack and pinion ejector ram-slider provided with a spring biased detent, producing forward feed movement of each DIP in turn from the snorkel magazine through an ejection portal, pausing with the DIP's terminals protruding for alignment with the mounting holes in the printed circuit board, followed by ejection of the DIP from the portable tool for insertion, produced by further squeezing movement of the trigger-handgrip.

18 Claims, 16 Drawing Figures

EJECTED

FIG. 13

RETURNING

DIP STORAGE, INSERTION AND EJECTION TOOL

This invention relates to portable assembly tools for fabricating integrated electronic circuits assembled on printed circuit boards, and particularly to hand-held storage and dispensing tools or orienting and installing a number of DIP components in a rapid series of successive assembly operations.

BACKGROUND OF THE INVENTION

Enormous cost advantages and reliability of integrated circuit packages such as the dual-in-line packages commonly known as "DIPs" have led to ever-widening use of these integrated circuit units in printed circuit electronic assemblies for electrical and electronic devices of all kinds. Computers, switching and switchboard equipment, television, radio, audio, consumer electronic products and scientific instrumentation all make wide use of printed circuits carrying integrated circuit packages. Electrical connections mechanically securing and electrically bonding the terminals of the integrated circuit packages to the terminal apertures of the printed circuit boards are made by insertion of the protruding package terminals through these terminal apertures, generally followed by wave soldering steps. I.C. sockets are frequently used on printed circuit boards, but they have varying degrees of mechanical insertion resistance, requiring frequent adjustment of automatic insertion machinery.

Alignment of the packages and their insertion can be performed manually, but seizing, gripping, holding, orienting and inserting these small DIPs is a tiring manipulation task for the operator. Orientation of the DIPs is critical, and a DIP inserted upside down is generally useless. In addition, certain varieties of DIPs such as MOS and CMOS DIPs are extremely sensitive to static electrical charges, which may be generated merely by handling the DIP itself. Electrical grounding of the DIP terminals during handling and insertion is the only practical way to avoid serious damage or destruction of the DIP by such harmful static charges.

DIPs are normally packed for shipment and storage in elongated hollow plastic tubes of irregular cross-sectional configuration, matching the angularly splaying protruding rows of terminals on each side of the DIP. Being packed in these tubular "dipsticks", end to end in proper orientation, the terminals of the DIPs are all protected inside the tubular dipstick and cannot be bent or damaged or affected by static electrical charges. Mounting of these dipsticks in dipstick storage racks or dispensers for release of the DIPs therefrom exposes the DIP terminals upon dispensing to deformation or damage or to harmful static charges.

Portable or plunger-actuated DIP-holding devices such as those shown in U.S. Pat. No. 3,688,393, 3,628,244, 3,535,763, 3,443,297, and 3,896,533 required individual loading of each DIP into the device prior to its transportation and insertion in the printed circuit board, with unavoidable risk of damage or static charge degradation of the integrated circuits. For these reasons there is a serious unfilled need for a portable hand-held DIP insertion tool having the capability of receiving and holding the loaded dipstick storage tube in the manner of an automatic-dispensing magazine, insuring that DIPs are physically and electrically isolated until they are actually installed in the printed circuit board itself.

A bottom-delivery dispensing device having a "squared-ring" shape has been marketed by Unitool Corporation of Sunnyvale, California under the name "DIPSHOT", having the limited capability of dispensing the DIP with its terminals extending downward beneath the operator's hand, which grips one side of the ring. Such downward dispensing creates unavoidable alignment and observation difficulties, and this device is less convenient to use than a conventional stapling gun.

SUMMARY OF THE INVENTION

The present invention provides a lightweight portable hand-held tool for use in producing printed circuit assemblies with a squeezable handle pistol grip surmounted by an incrementally detented ram ejection mechanism. The device is topped by a rearwardly raked loading "snorkel" tube enclosing an upwardly opening component chute whose upper portal is adapted for engaging and holding a "dipstick" storage tube for dual in-line package or "DIP" integrated circuit assemblies, which are aligned end to end therein for lengthwise sliding, dispensing movement. The squeezable trigger-handgrip extends downward beneath the ram mechanism and actuates a rack and pinion ejector ram-slider provided with a spring biased safety latch detent, producing forward feed movement of each DIP in turn from the snorkel magazine chute through an ejection portal, pausing with the DIP's terminals protruding for aligment with the mounting holes in the printed circuit panel. This is followed by ejection of the DIP from the portable tool for insertion, produced by further squeezing movement of the trigger-handgrip, which overrides the detent safety latch. The ram slider then returns past the detent mechanism to receive a new DIP from the component chute.

OBJECTS OF THE INVENTION

Accordingly, a principal object of the present invention is to provide a portable lightweight hand-held DIP storage, alignment and insertion tool capable of receiving and holding a loaded dipstick storage tube in dispensing-magazine condition while the device is manually positioned and actuated to present each DIP in trun with its terminals protruding for alignment and insertion in the printed circuit board, and thereafter ejecting each delivered DIP in turn for insertion mounting installation on a printed circuit board.

A further object of the invention is to provide a DIP storage and dispensing tool of the above character having one or more intermediate detented conditions of its DIP-delivery mechanism, including a DIP-presented condition in which the DIP terminals protrude a short distance from the device for alignment-insertion while the DIP itself is still firmly held against dislodgement.

Another object of the invention is to provide a portable DIP storage and installation tool of the above character wherein the loaded dipstick storage magazine is removably anchored in the device, extending upward and diagonally rearward over the operator's shoulder, permitting the device to be used for horizontal dispensing, and tilted forward for vertical DIP insertion in a horizontal board, in a position presenting the loading dipstick diagonally forward over the workspace.

Still another object of the invention is to provide DIP storage and insertion tools of the above character incorporating static electricity discharge conductors and a ground path, assuring that static charges are dissipated and that the movement of each dip successively through the insertion tool creates no frictional static charge which might cause damage or degradation of the installed integrated circuit.

Other objects of the invention will in part be obvious and will in part appear hereinafter.

The invention accordingly comprises the features of construction, combinations of elements and arrangements of parts which will be exemplified in the constructions hereinafter set forth, and the scope of the invention will be indicated in the claims.

For a fuller understanding of the nature and objects of the invention, reference should be had to the following detailed description taken in connection with the accompanying drawings.

THE DRAWINGS

FIGS. 5, 7, 9, 11 and 13 are successive fragmentary cut-away views of the central housing portion of the tool of FIG. 2, with the DIP ejection ram-detent mechanism shown in successive positions during its operating cycle.

FIGS. 6, 8, 10 and 12 are fragmentary top plane views of the DIP being delivered, aligned and inserted in the printed circuit board, with FIGS. 6, 8 and 10 showing the DIP-guiding portions of the tool while FIGS. 10 and 12 show the printed circuit board in which the DIP is being inserted. FIG. 6 shows the DIP in the tool position illustrated in FIG. 5; FIG. 8 shows the DIP in the tool position illustrated in FIG. 7; FIG. 10 shows the DIP in the tool position illustrated in FIG. 9; and FIG. 12 shows the DIP after insertion-ejection from the tool in the position shown in FIG. 11.

PREFERRED EMBODIMENT

Figure 1:
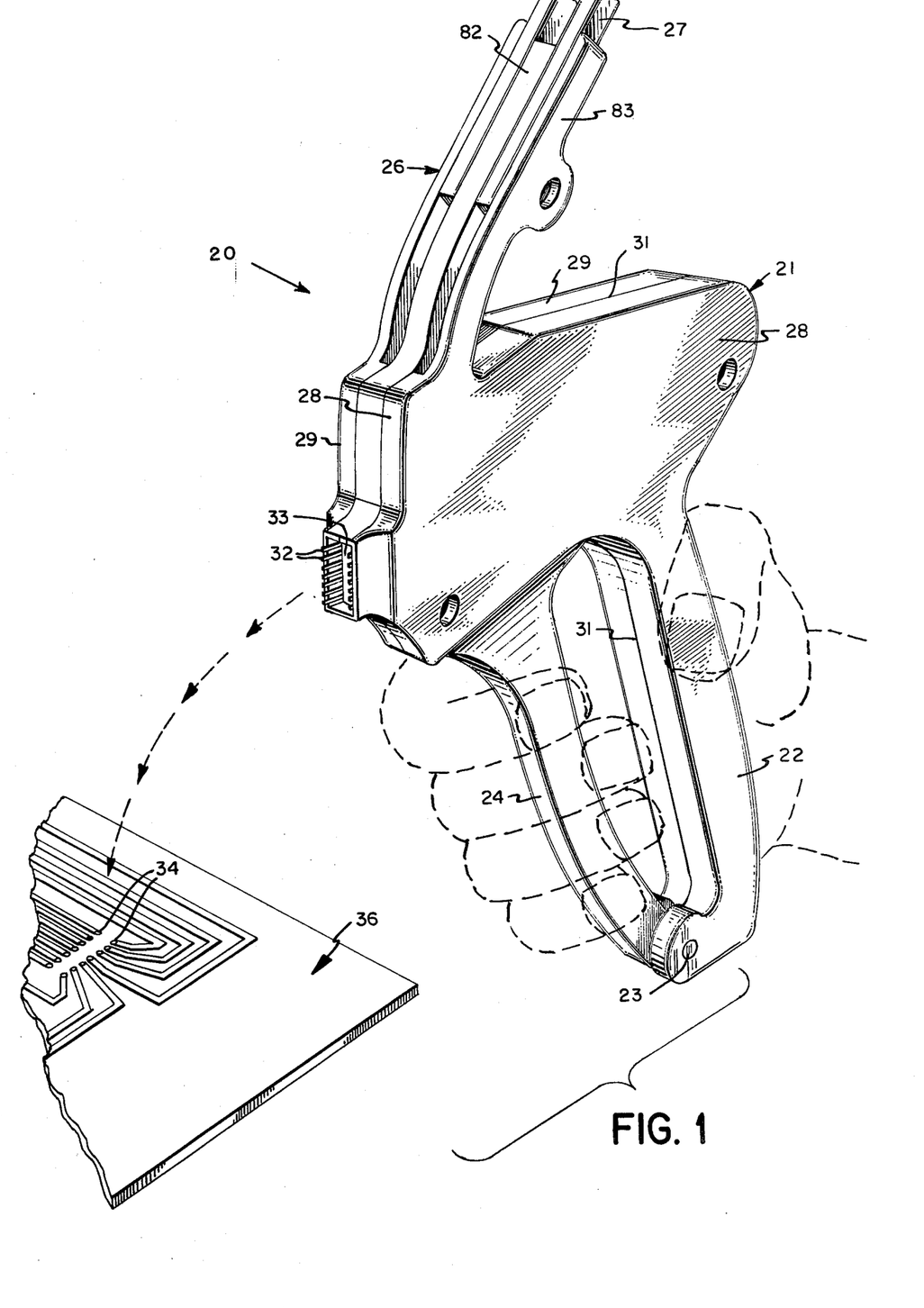
FIG. 1 is a perspective view of a DIP storage and insertion tool of the present invention showing in the foreground a printed circuit board incorporating perforations dimensioned to receive the protruding terminals of an integrated circuit DIP.

The lightweight portable tools of this invention, as shown in FIG. 1, comprise a housing preferably formed in two halves of injection molded plastic material or of light die-cast metal such as aluminum. Thus, in FIG. 1, the tool 20 is provided with a central housing 21, having a depending hand-grip 22, provided at its lower end with a pivot pin 23 to which a vertically elongated trigger 24 has its lower end pivotally secured for rearward angular movement when the operator squeezes trigger 24 toward hand grip 22. The upper end of trigger 24 fits inside the central housing portion 21, actuating the DIP-ejector ram-detent mechanism.

Figures 2, 2A, 3, 4:
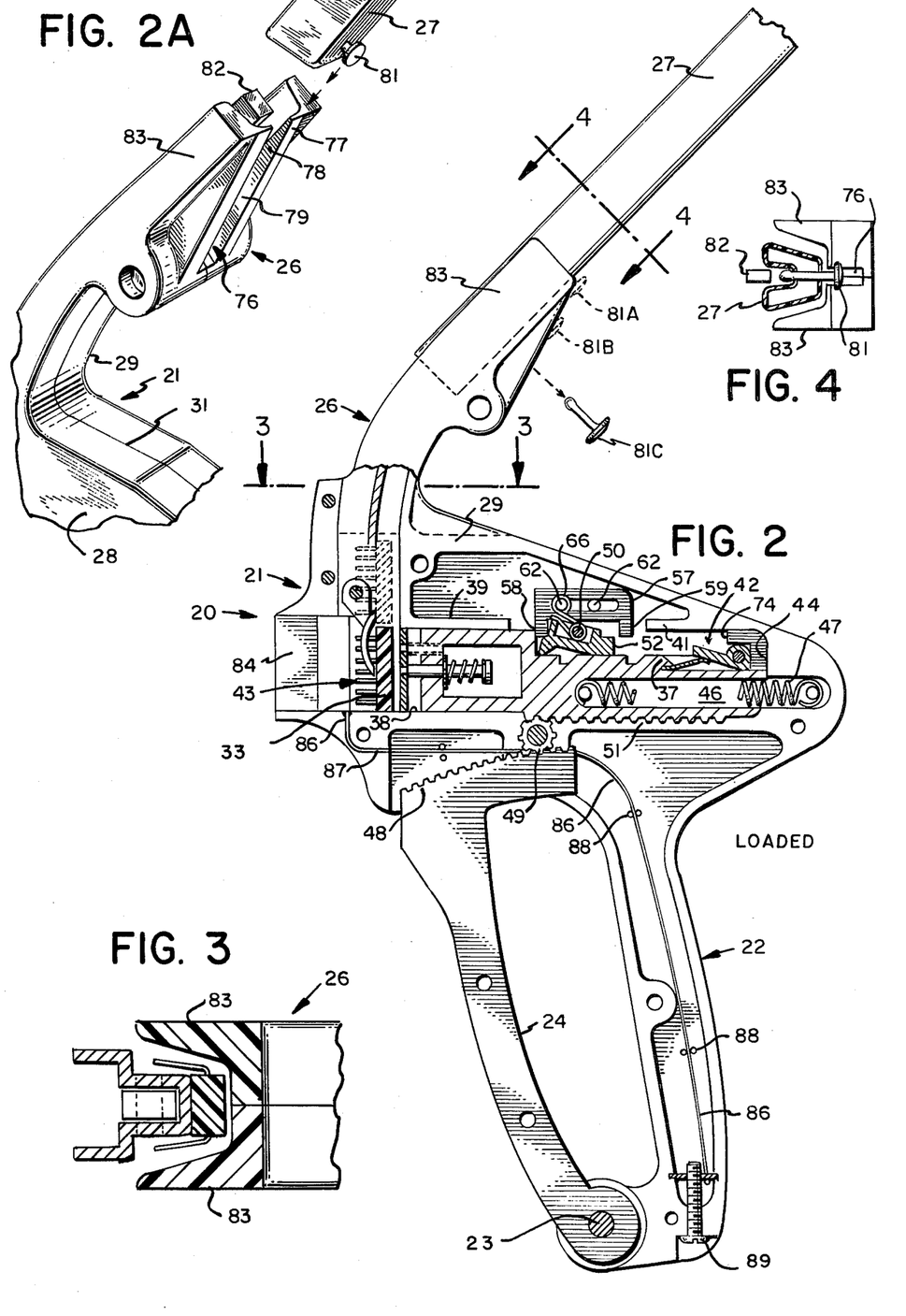
FIG. 2 is a side elevation view, partially broken away, of the DIP storage and insertion tool of FIG. 1, showing a magazine-type dipstick storage tube mounted in operating position in its upper "snorkel" end and having its central portion cut away to show the ram-detent DIP ejection mechanism.
FIG. 2A is a fragmentary top rear corner perspective view of the "snorkel" mechanism showing the lower end of a dipstick storage tube approaching insertion therein.
FIG. 3 is a fragmentary cross-sectional plan view taken along the plane 3—3 shown in FIG. 2, showing the lower end of the snorkel portion of the tool with a DIP integrated circuit in position at the base of the component delivery chute, ready for ejection.
FIG. 4 is a cross-sectional view of the "dipstick" DIP storage tube in its shipping condition, with a DIP-retaining pin shown in place for securing the DIPs stored end to end therein.

Extending upward and raked rearwardly from central housing portion 21 is snorkel portion 26 shaped to receive in removable engagement the lower end of a hollow DIP storage tube or "dipstick" 27, as indicated in FIG. 2. Left-hand housing half 28 and right-hand housing half 29, meeting each other along a central abutment line 31 in the central plane of the device, are recessed in concavely facing relation to enclose the operating mechanism of the device inside the hollow central housing portion 21. Housing halves 28 and 29 likewise form cooperatingly the hollow upstanding snorkel portion 26 and the downwardly depending handgrip 22.

Shown protruding slightly from the central forward end of tool 20 are the tips of the diverging rows of terminals 32 of a DIP 33 presented for alignment and insertion in parallel rows of terminal holes 34 of a printed circuit board 36 shown at the left-hand side of FIG. 1.

DIP EJECTING RAM AND SLIDEWAY

The partially broken away side elevation view of FIG. 2 shows the left-hand housing half 28 removed, revealing the concave interior of right-hand housing half 29. Generally rectangular sliding ram 37 is mounted for sliding forward and rearward movement inside the housing halves 28 and 29, confined in a longitudinal slideway 42 formed between a lower ledge 38 and a pair of upper shelves, a rearwardly extending forward upper shelf 39 and a forwardly extending rear upper shelf 41.

Resulting slideway 42 accommodates the ram 37 for sliding movement to and from the rear seated position illustrated in FIG. 2, in which a fresh DIP 33 is loaded into the DIP chamber 43, by gravity feed down dipstick 27 through the hollow interior component delivery chute inside snorkel 26. The rearward end of slideway 42 is a blind end 44, closed by the two housing halves 28 and 29, and ram 37 is seated against this blind end 44 in its rearmost position, as shown in FIG. 2.

Figures 5, 6:
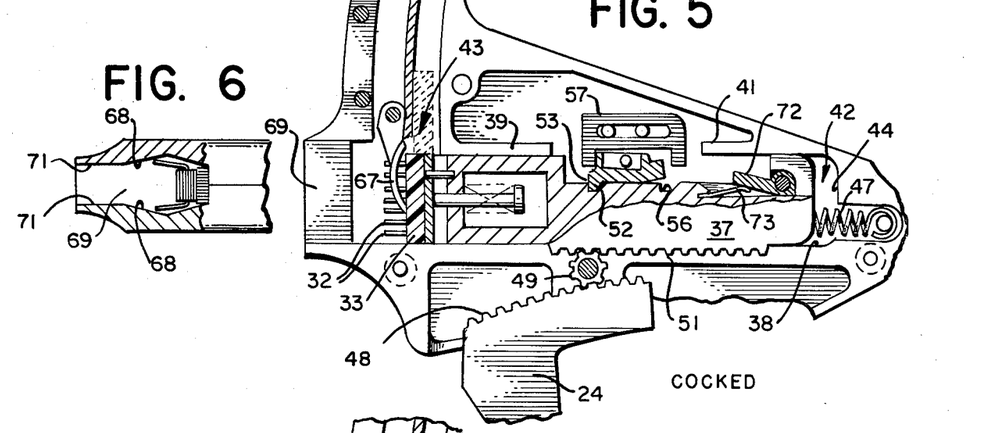
Figures 7, 8:
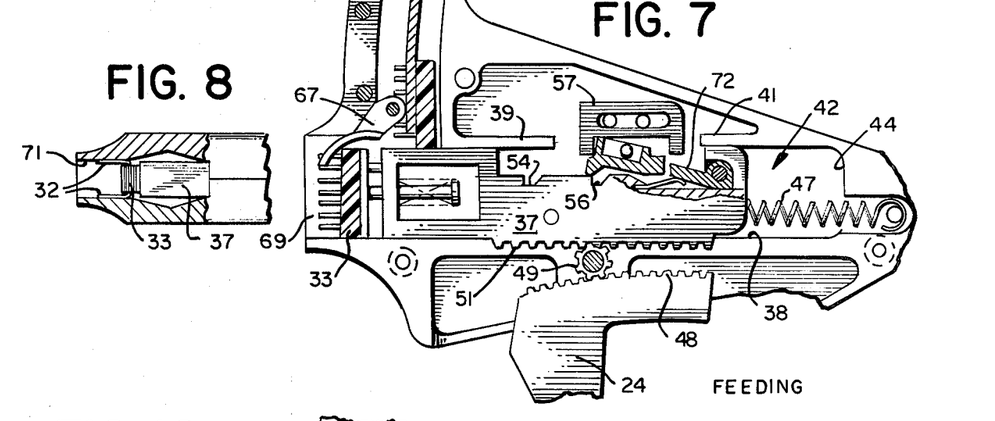
Figure 9:
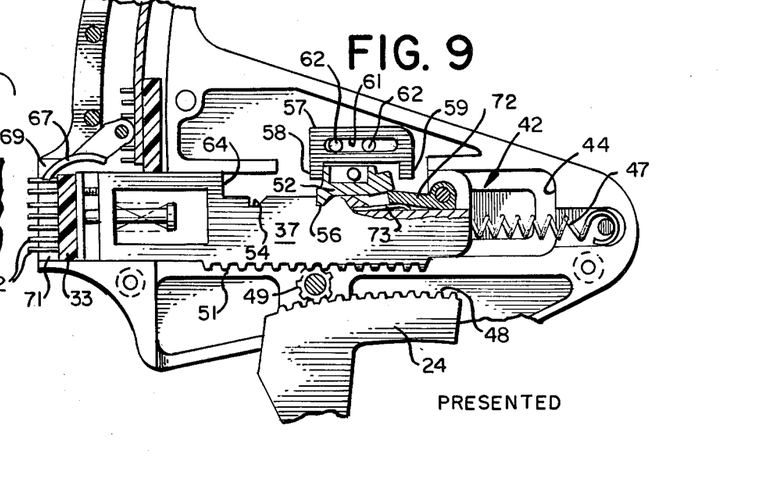
Figure 11:
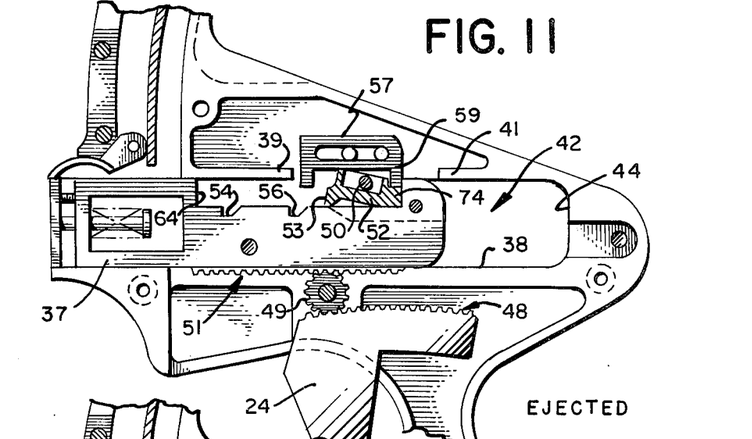

Ram 37 is adapted for sliding movement from this rearmost position through the successive positions illustrated in FIGS. 5, 7 and 9 to its forwardmost position in FIG. 11, in which the DIP 33 has been fully ejected from the tool 20. An elongated longitudinal blind cavity 46 opens rearwardly at the rear lower end of ram 37 and extends forwardly inside ram 37 for approximately half the length of the ram. A helical coil tension spring 47 is mounted in blind cavity 46, with the forward end of coil spring 47 being anchored to a transverse pin at the forward end of the cavity. The rearward protruding end of spring 47 is similarly secured to a transverse pin anchored in right housing half 29 as shown in FIG. 1. Tension spring 47 resiliently biases ram slide 37 rearwardly toward its rearward position shown in FIG. 2, seated against the internal blind end 44 of slideway 42.

Forward sliding movement of ram 37 is produced by angular pivoting movement of trigger 24 about pivot pin 23 at the lower end of hand grip 22; the upper end of trigger 24 is formed as an arcuate sector rack 48, engaging a pinion 49 journalled for rotation between the two housing halves 28 and 29 forming the central housing portion 21. Also engaged with pinion 49 is a longitudinal rack 51 formed along the rear lower portion of ram 37. Thus, as shown in the drawings, squeezing of trigger 24 toward hand grip 22 by the user causes pivoting angular movement of trigger 24 in a clockwise direction, as viewed in the figures, causing counter-clockwise rotation of pinion 49 which in turn impells longitudinal rack 51 forwardly, driving ram 37 from right to left in its slideway 42 between ledge 38 and shelves 39 and 41. This sliding movement from right to left toward the forward portion of the tool 20 causes extension of the tension spring 47, and this extension resiliently biases the slidable ram 37 for its return travel from its forwardmost position shown in FIG. 11 through that shown in FIG. 13 to its rearmost position shown in FIG. 2.

RAM DETENT MECHANISM

Sliding movement of ram 37 is not a single continuous uninterrupted traverse of its path of movement from right to left, however. A detent mechanism illustrated in the figures interrupts the forward progress of ram 37 to divide this forward movement into several successive stages.

This intermittent interrupted sliding movement is produced by a safety latch 52 (FIGS. 2 and 14) pivotally mounted on a pivot pin 50 between housing halves 28 and 29 above ram 37 and having a depending flange 53 (FIGS. 5 and 14) protruding downwardly for engagement with one of two latch notches 54 and 56 (FIG. 14) opening upward on the rear upper edge of ram 37. Safety latch 52 and its depending flange 53 as well as notches 54 and 56 are most clearly shown in the enlarged fragmentary perspective view of FIG. 14.

Above the pivotally mounted safety latch 52 is a latch release slider 57 (FIGS. 9 and 14) formed substantially in the shape of a flattened letter "R", and having forward and rearward depending flanges 58 and 59 respectively positioned for alternative engagement with the forward and rearward ends of the safety latch 52. A longitudinal slot 61 formed in the slider 57 accommodates a pair of slider posts 62 integrally anchored to the rear housing half 29, the slider 57 being slidingly captive on the posts 62.

Figure 13:
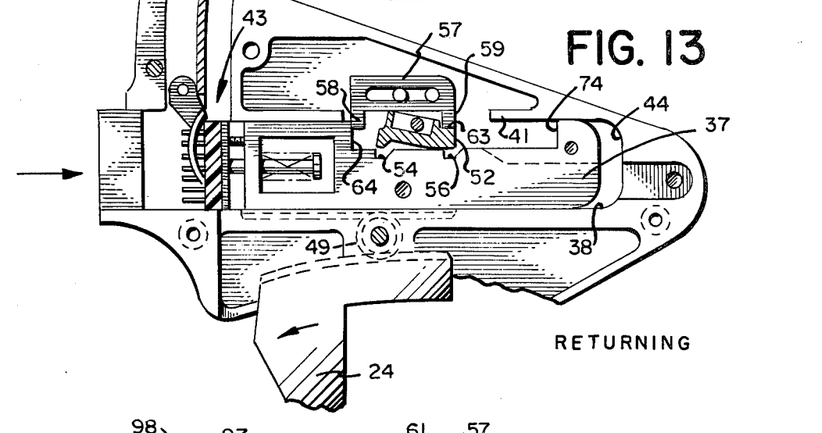
Figures 14, 15:
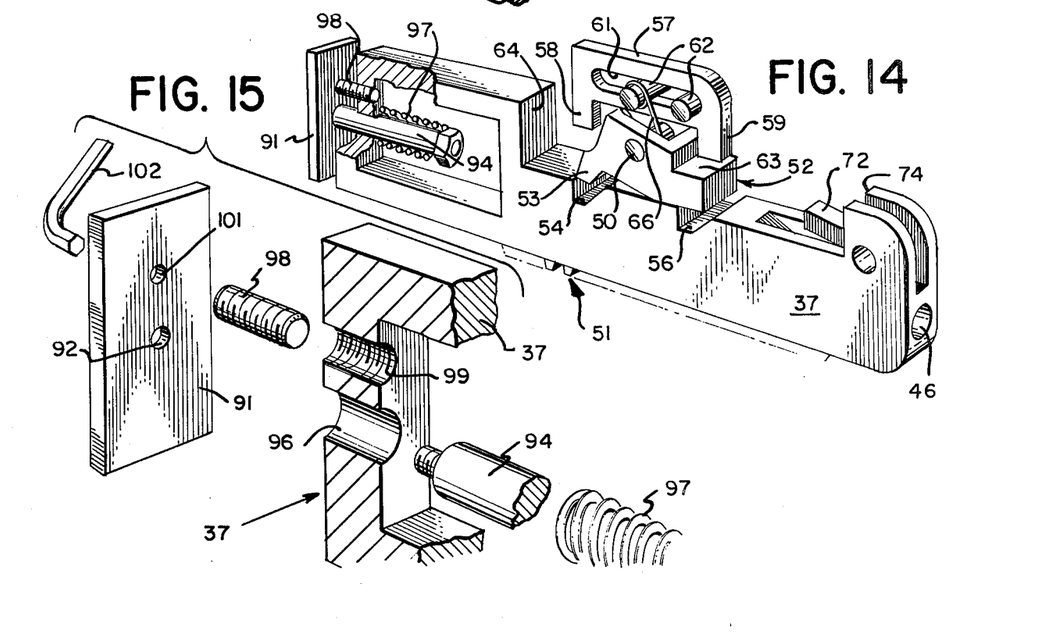
FIG. 14 is a fragmentary perspective view showing the dip ejection ram and its associated detent members.
FIG. 15 is an enlarged fragmentary exploded perspective view of the forward end of the DIP-ejecting ram, showing the adjustable ram plate utilized to adapt the device for delivering DIPs having different body heights.

Slider 57 is thus mounted for longitudinal sliding movement from a rearmost position shown in FIGS. 5, 7 and 9 to a forwardmost position shown in FIGS. 11, 13 and 14, where its rear depending flange 59 rests upon a rear ledge 63 of safety latch 52, which is thereby retained in its clockwise pivoted position on its pivot pin 50, with its depending forward flange 53 raised above the level of notches 54 and 56, as shown in FIG. 14.

In this position, the ram 37 is free to move from its forwardmost position in FIG. 11 under the influence of tension spring 47 drawing it rearwardly to the right in FIG. 13 with notches 56 and 54 passing under flange 53 of safety latch 52 until ram 37 passes the "returning" position shown in FIG. 13, where its rearwardly facing shoulder 64 engages forward depending flange 58 of slider 57, causing slider 57 to move rearwardly from the position shown in FIG. 13 to the position shown in FIG. 2.

Ram 37 thus completes its rearward travel toward the blind end 44 of its slideway 42 under the influence of the contracting tension spring 47 while depending flange 53 of safety latch 52 remains ahead of the forwardmost notch 54 in ram 37. In this "loaded" position shown in FIG. 2, the rear position of the latch release slider 57 brings its rear depending flange 59 beyond rear ledge 63 of safety latch 52, leaving safety latch 52 free for counter-clockwise pivoting movement about its pivot mounting pin 50 and dropping its flange 53 into notch 54 as soon as ram 37 begins its forward travel to the position shown in FIG. 5 under the influence of the trigger 24 squeezed toward hand grip 22 by the operator.

The counter-clockwise pivoting movement of safety latch 52 is caused by a hair-pin shaped wire spring 66 having its bight encircling the pivot pin 50 on which safety latch 52 is pivotally mounted, and having its upper end fixed around one of the slide posts 62 in anchoring engagement. The lower free end of hair pin wire spring 66 extends engagingly over an upper forward surface of safety latch 52, and the resilient downward force supplied by this forwardly extending lower free end of hair pin spring 66 urges safety latch 52 toward its counter-clockwise position shown in FIG. 5 and FIG. 9.

Thus, as ram 37 moves forward from its rearmost position of FIG. 2 to its "detent" or "cocked" position shown in FIG. 5, the operator feels the ram 37 retarded by the frictional engagement of the DIP terminals against the converging sidewalls 68 of the DIP chamber 43. Flange 53 then drops into notch 54, preventing rearward movement of the ram 37 under the influence of the extended tension coil spring 47, and preventing jamming by one DIP behind another.

The operator can easily override this detent action, however, because the rear faces of flange 53 and notch 54 are chamfered to permit upward camming displacement of the pivoting safety latch 52 by notch 54 as the operator squeezes trigger 24 further toward handgrip 22, causing counter-clockwise rotation of pinion 49 to drive longitudinal rack 51 on ram 37 in a forward direction.

Release slider 57 remains in its rearward position as ram 37 continues to move forward from the cocked position shown in FIG. 5 through its feeding stage indicated in FIG. 7 with depending flange 53 of safety latch 52 riding on a raised land portion of ram 37 between the notches 54 and 56 as shown in FIG. 7. It will be noted that the cocked position of ram 37 shown in FIG. 5 brings the forward end of the ram into engagement with the top surface of the DIP 33 and urges the DIP slightly forwardly into engagement with a resiliently pivoted spring finger 67, which serves to steady the DIP 33 and hold it resiliently in stabilized position against the forward end of ram 37.

As ram 37 advances from right to left toward the position shown in FIG. 7, the resilient spring finger 67 is pivotally displaced upwardly out of the path of advacing ram 33 while the terminals 32 of DIP 33 are simultaneously urged into engagement with the converging lateral sidewalls 68 of the DIP delivery chamber 69, as shown in the cross-sectional top plan view of FIG. 6. The continuing forward movement of ram 37 toward the advancing position of FIG. 7 impells the DIP 33 forward between the converging sidewalls 68, causing resilient deflection of the normally diverging pairs of terminals 32 into sliding engagement between the exit portal walls 71 in the position shown in the fragmentary cross-sectional plan view of FIG. 8. The resilient deflection of terminals 32 of the DIP 33 between the walls 68 and 71 steadies and stabilizes the advancing DIP for its sliding forward movement ahead of ram 37, supplementing and finally replacing the stabilizing action of the pivoted spring finger 67 as this is pivotally moved upwardly by the advancing DIP.

"DIP PRESENTED" DETENT POSITION

A pivoted stop 72 journalled at the rear end of ram 37 is free to move angularly from a depressed position (FIG. 9) to an upper diagonally protruding position (FIG. 7) toward which it is resiliently biased by an underlying captive leaf spring 73 carried by ram 37. As ram 37 moves leftward, past the feeding position shown in FIG. 7, the forward end of pivoting stop 72 protruding diagonally upward from the rear end of ram 37 comes into abutting engagement with the rearward end of safety latch 52, as indicated in FIG. 7. This blocks further forward movement of ram 37 momentarily. This interruption is only momentary, however, because the arrival of pivoting stop 72 in abutting engagement with the rear end of safety latch 52 coincides with the arrival of the rearward notch 56 under depending flange 53 of safety latch 52. Therefore, the suddenly arrested ram 37 is directly positioned to receive in its notch 56 the depending flange 53 of safety latch 52, which is pivoted counter-clockwise about pivot pin 50 by the action of the hairpin spring 66 shown in FIGS. 2 and 14, moving safety latch 52 counter-clockwise into the engaged detent position shown in FIG. 9.

Figure 10:
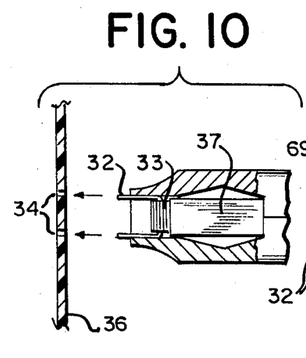

In this "presented" position, the tips of terminals 32 of DIP 33 protrude beyond the exit portal formed between walls 71 of the DIP delivery passage, as indicated in FIGS. 9 and 10. Rearward movement of ram 37 under the influence of the extended tension spring 47 is again blocked by this detent engagement of flange 53 in notch 56, holding the DIP in its presented condition for the operator to align and insert the terminals 32 in the apertures 34 in the printed circuit board 36 as indicated in FIG. 1.

DETENT OVERRIDE DURING RAM RETURN

Figure 12:
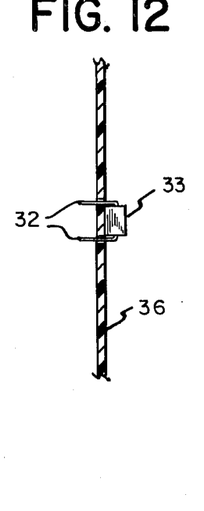

After insertion, the operator can override the detented frictional engagement of ram 37 by further squeezing of trigger 24 toward handgrip 22, because the counter-clockwise pivoting movement of latch 52 about pin 50 has raised its rear end above the abutting end of the pivoting stop 72, as shown in FIG. 9. Forward movement of ram 37 carries pivoting stop 72 forward under raised safety latch 52, thereby depressing the flat leaf spring 73 beneath stop 72 and urging stop 72 downward into an underlying groove formed in ram 37 as indicated in FIG. 9. This forward advancing movement of ram 37 thus allows the operator to expel DIP 33 by driving its terminals 32 insertingly through the mating apertures 34 in circuit board 36 as indicated in FIGS. 11 and 12.

The forward movement of ram 37 brings its upstanding rear shoulder 74 into engagement with the slider 57, which is thereby driven forward from its rear position shown in FIG. 9 to its forward position shown in FIGS. 11, 13 and 14 with its rear depending flange 59 resting on the rear ledge 63 of safety latch 52, thereby retaining safety latch 52 in its clockwise pivoted position, with its depending flange 56 raised above the level of notches 53 and 54.

In this manner, the detent interruption of the sliding movement of ram 37 is overridden during the left to right return movement of ram 37, with the notches 56 and 54 passing under the raised flange 53 as indicated in FIG. 14 until ram 37 reaches the position shown in FIG. 13, where the forward shoulder 64 of ram 37 engages the forward depending flange 58 of slider 57. Continuing left to right sliding return movement of ram 37 thereafter drives slider 57 rearwardly to the position shown in FIG. 2 where depending flange 53 of safety latch 52 is shown resting on ram 37 ahead of the forwardmost notch 54.

Safety latch 52 is thus activated for detent action during the next ensuing forward movement of ram 37. Thus the detent action of the safety latch and the cooperating mechanism features provide the desired detent operation, interrupting the forward movement of the ram, without interfering with the return movement of the ram after ejection of the DIP.

ADJUSTABLE RAM FACE

The forward end of ram 37 is provided with a resiliently retractable ram face 91, formed as a rectangular plate best seen in FIGS. 14 and 15. Threaded aperture 92 in the center of this plate is dimensioned to receive a reduced threaded stud end 93 of an alignment rod 94 slidably extending rearwardly through a longitudinal aperture 96 into a transverse cavity extending laterally through ram 37. The rearward end of alignment rod 94 is headed to retain a captive compression helical coil spring 97 urging alignment rod 94 rearwardly to draw plate 91 back toward ram 37.

A set screw stop 98 threaded into a tapped hole 99 adjacent to aperture 96 protrudes forwardly beyond ram 37 for abutting engagement against the backside of plate 91. A set screw adjustment hole 101 passes through plate 91 in axial alignment with a central hexagonal socket or slot in the protruding forward end of set screw 98. A hex wrench 102 or screwdriver may be inserted through adjustment hole 101 to rotate set screw 98 in tapped hole 99, varying the distance it protrudes beyond the forward end of ram 37.

Since set screw 98 provide the stop against which ram face 91 abuts under the resilient force supplied by spring 97 causing alignment rod 94 to draw plate 91 rearwardly, the hex wrench adjustment of set screw 98 varies the overall length of the assembly of plate 91, rod 94 and ram 37. By this means, the forward face of plate 91 coming in contact with the top face of each DIP in the DIP chamber may be adjusted forwardly and rearwardly to accommodate DIPs of varying heights with a high degree of precision.

SNORKEL DIP FEED CHUTE

The topmost open end of snorkel 26 is shaped to accommodate in sliding insertion relationship the lower end of dipstick 27, as indicated in FIGS. 1, 2 and 2A. The rear wall of snorkel 26 is formed with a vertical slot 76 flanked by a pair of chamfered ramp walls 78 of increasing thickness, extending from a thin upper entry edge 77 along a sloping inclined ramp section 78 to a thicker blind end 79, all as indicated in FIG. 2A. The transverse width of slot 76 receives the shaft of a rivet-shaped DIP securing pin fastener 81, whose head spans slot 76 and overlappingly extends on each side thereof behind the ramp walls 78. These walls perform the function of the claws of a claw hammer in withdrawing fastener 81 from the lower end of dipstick 27. As indicated in FIG. 4, the fastener 81 is provided with a slightly enlarged blunt forward end inserted by force fit through tightly fitting apertures in the rear wall and the forward wall of the U-shaped dipstick 27 to form a DIP securing end retainer assuring that the DIPs packaged end to end therein will be retained until they are to be dispensed by the operator.

An opening for insertion of dipstick 27 is formed within snorkel 26 behind a guide bar 82 upstanding centrally in the U-shaped space between sidewalls 83 and the ramp shaped rear walls 78. This forms an upward facing opening having a substantially U-shaped cross-section accommodating the generally U-shaped cross-section of the dipstick indicated in FIG. 4.

As the dipstick 27 is telescopingly inserted into the upper end of snorkel 26, the pin 81 is neatly cammed rearwardly and withdrawn by the ramp walls 78, and is thereby extracted and removed from the dipstick 27 as indicated in the three successive fastener positions indicated as 81A, 81B and 81C in FIG. 2.

Thus, as indicated in FIG. 2, the removal of the dip securing pin 81 allows the DIPs stored in dipstick 27 to slide downwardly through the hollow chute formed within snorkel 26 to the position shown in solid lines in the central part of FIG. 2 and successive DIPs are stacked, like rounds of ammunition in a magazine, one above the other as indicated in dash lines in FIG. 2, providing the entire dipstick load of stacked DIPS in readily dispensible orientation, with the first DIP standing endwise directly ahead of ram 37.

ANTI-STATIC CHARGE DISSIPATION

To assure that static electrical charges are grounded and do not accumulate on any of the terminals of the DIP 33 ready for dispensing, a pair of metal ground plates 84 of stainless steel or the like (FIG. 2) are preferably provided on the inward facing walls 68 and 71 of the DIP delivery passageway. Ground plates 84 thus form a liner surface for the facing terminal-contacting sidewalls of the DIP delivery passage, minimizing the abrasive effects of the dispensed DIP terminals and thus assuring the dimensional stability and terminal deflecting operation of these sidewalls to stabilize the delivery of each advancing DIP ahead of ram 37 through the positions shown successively in FIGS. 6, 8 and 10.

This endwise sliding movement of the terminals 32 of each advancing DIP 33 places these terminals in good electrical contact with the ground plates 84, assuring that the resulting friction between terminals 32 and sidewalls 84 produces no accumulation of static electrical charges on terminals 32. Instead such charges are conducted away by a ground conductor 86 secured as by soldering to both ground plates 84 and extending through a shallow groove 87 formed in one or both of the housing halves 28 or 29 leading beneath lower ledge 38 into the hollow interior underside of the central housing 21.

One of the housing halves 29 is provided with upstanding pairs of conductor securing posts 88, spaced apart just enough to receive and accommodate the conductor 86 between them, after which the posts may be deformed by the heat of a soldering iron or a light hammer blow in the case of metal housing parts, in order to secure the ground conductor 86 in position extending within central housing portion 21 and thence downwardly inside handgrip 22 to be connected to a grounding terminal post or threaded screw 89 exposed at the lower end of handgrip 22 for connection to an external ground conductor not shown in the drawings.

By this means, when the tool of this invention is being used to store and insert static charge-sensitive integrated circuits such as MOS and CMOS, a convenient grounding path is provided for automatic anti-static charge dissipating operation, assuring grounding of the DIP terminals at all times from its sliding downward delivery from the lower end of the dipstick 27 until it is aligned and inserted in the perforated circuit board by the operator.

ANGULAR ORIENTATION: FLEXIBLE VERSATILITY

The central housing portion 21 of the tools of this invention presenting each DIP 33 facing forwardly, directly away from the operator, provide for unusually convenient alignment and insertion of the DIP terminals 32 in the perforations 34, whether the printed circuit panel is held vertically ahead of tool 20, or horizontally as indicated in FIG. 1, or at any angle therebetween. Moreover, the rearwardly raked snorkel portion 26 normally provides rearward slanting deployment of the extending dipstick 27, which may be several feet long, for example. Forward pivoting movement to bring the DIP terminals 32 aiming downward for downward insertion into perforations 34 merely swings the dipstick 27 forwardly through an arc normally no more than 90°, bringing it to a forward slanting deployed position but assuring that DIPs stored therein will remain stored therein and will not be dislodged by manipulation of the supporting tool 20 during its operation. Preferably, a second DIP securing pin fastener 81 at the uppermost end of dipstick 27 provides further assurance that DIPs will not be inadvertently dropped or flung from the open upper end of the dipstick 27.

It will thus be seen that the objects set forth above, among those made apparant from the preceding description, are efficiently attained and, since certain changes may be made in the above construction without departing from the scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described, and all statements of the scope of the invention, which as a matter of language, might be said to fall therebetween.

What is claimed is:

1. A portable hand-held storage-dispensing tool for components having arrayed diverging pairs of terminal posts protruding therefrom, comprising:
   A. a central housing defines a component delivery chamber having an exit portal opening outward therefrom through a forward portion of the housing,
   B. means forming a longitudinal elongated slideway in said housing having a rear blind end and extending forwardly therefrom through the component delivery chamber to the exit portal,
   C. means forming an upwardly opening component chute entering the component delivery chamber, through an upper portion thereof,
   D. a ram slidingly mounted in the slideway for longitudinal forward and rearward reciprocating movement between a rearmost position abutting the blind end and a forwardmost position juxtaposed to the exit portal, E. a detent safety latch interferingly engageable with the ram to resist movement of the ram, F. a squeezable trigger-handgrip extending downward from said central housing and connected to translate squeezing contraction of the trigger-handgrip into sliding forward movement of the ram; and G. detent-release means connected to override and disengage the detent safety latch from the ram in response to squeezing contraction of the trigger handgrip.

2. The portable storage-dispensing tool defined in claim 1 wherein the ram and the trigger-handgrip each incorporate facing toothed racks, and wherein the central housing incorporates a pinion journalled therein in engagement with the toothed rack on the sliding ram and also with the toothed rack on the trigger-handgrip, whereby squeezing contraction of the trigger-handrip rotates the pinion to drive the ram forwardly between its two extreme limit positions.

3. The tool defined in claim 1 wherein the ram is resiliently biased toward its rearmost position abutting the blind end of the slideway.

4. The portable storage-dispensing tool defined in claim 1 wherein the detent safety latch comprises a rocking member pivotally mounted in the central housing for rocking movement into a latched position interferingly engaged with the ram and alternatively into an unlatched position clear of the ram throughout its path of sliding travel in the elongated slideway.

5. The tool defined in claim 4 wherein the ram is provided with at least one notch and wherein the rocking member has a flange engaging the notch in the latched position, retarding forward movement of the ram near the forwardmost end of its path of sliding movement.

6. The tool defined in claim 5 wherein the rocking member is resiliently biased toward its latched position.

7. The tool defined in claim 5 wherein the notch and the flange have cooperating angularly sloping camming exit surfaces positioned to convert forward ram movement into cammed disengaging rocking movement of the rocking member from its latched position to its unlatched position.

8. The tool defined in claim 4 including a safety latch release member movably mounted in the central housing for movement between a blocking position maintaining the safety latch rocking member in its unlatched position, and an unblocking position freeing the rocking member for rocking movement into its latched position.

9. The tool defined in claim 8 wherein the ram is provided with shoulder means flanking and engaging the latch release member, positioned to move it to its blocking position in response to forward movement of the ram into its forwardmost position, and to move the release member into its unblocking position in response to rearward movement of the ram toward its rearmost position.

10. The portable component storage-dispensing tool defined in claim 1 wherein the detent safety latch is positioned to block rearward ram movement and impede forward ram movement at a ram position near its forwardmost position at which the ram has propelled a component from the component delivery chamber to be visible at the exit portal for alignment by the operator.

11. The portable hand-held storage-dispensing tool defined in claim 1 wherein the upwardly opening component chute is formed within an upstanding snorkel raked diagonally rearward.

12. The portable hand-held storage-dispensing tool defined in claim 1 wherein the means forming the chute are dimensioned for sliding telescoping removable engagement with a hollow tubular component shipping-storage tube sligned to provide a component-dispensing magazine delivering components to the delivery chamber.

13. The portable hand-held storage-dispensing tool defined in claim 12 and adapted to accommodate storage tubes each having a withdrawable component-securing pin spanning the tube, said pen having a central shank and enlarged ends wherein the chute means is provided with a tube-engaging portal having parallel tapered claw ramps flanking a slot accommodating the shank of the withdrawable component-securing pin spanning the tube, whereby telescoping insertion of the tube in the portal cammingly withdraws the pin from the tube to release components into the chute.

14. The portable storage-dispensing tool defined in claim 1 including in the central housing a pivotally mounted finger extending into the path of the ram between the component delivery chamber and the exit portal, with resilient biasing means urging the finger toward the advancing ram to stabilize components being impelled forwardly by forward advance of the ram.

15. The tool defined in claim 14 wherein the pivotally mounted finger is deflected and moved aside by advancing movement of the component.

16. The portable storage-dispensing tool defined in claim 1 wherein the exit portal is provided with converging sidewalls dimensioned to provide sliding frictional resistance to advacing ejection movement of each component impelled therebetween by the ram.

17. The portable storage-dispensing tool defined in claim 16 wherein the sidewalls are lined with electrically conductive material connected to a ground conductor to dissipate static charges by carrying them away from said components and thereby avoiding accumulation of said charges to harmful levels.

18. The portable hand-held storage dispensing tool defined in claim 1 wherein the ram is provided with an adjustably retractable ram face plate mounted on its forward end, whereby the ram is precisely adjustable to accommodate components of different sizes delivered to the chamber.

* * * * *

UNITED STATES PATENT AND TRADEMARK OFFICE
CERTIFICATE OF CORRECTION

PATENT NO. : 4,077,557
DATED : March 7, 1978
INVENTOR(S) : LaVerne Merritt Green It is certified that error appears in the above—identified patent and that said Letters Patent are hereby corrected as shown below:

```
Abstract, line 3  - change "piston" to "pistol"
Column 2, line 31 - change "aligment" to "alignment"
Column 2, line 45 - change "trun" to "turn"
Column 2, line 64 - change "loading" to "loaded"
Column 3, line 49 - change "plane" to "plan"

Column 8,  line 46 - change "provide" to "provides"
Column 9,  line 68 - insert --rearwardly-- before "within"
Column 10, line 13 - insert --printed-- after "perforated"

Column 11, line 21 - change "trigger-handrip" to "trigger-
                             handgrip"
Column 12, line 18 - change "sligned" to "aligned"
Column 12, line 24 - change "pen" to "pin"
Column 12, line 46 - change "advacing" to "advancing"
Column 12, line 53 - change "said" to "such"
```

Signed and Sealed this

Eighth Day of August 1978

[SEAL]

Attest:

RUTH C. MASON
*Attesting Officer*

DONALD W. BANNER
*Commissioner of Patents and Trademarks*